(12) United States Patent
Sperling et al.

(10) Patent No.: US 11,152,920 B2
(45) Date of Patent: Oct. 19, 2021

(54) VOLTAGE STARVED PASSGATE WITH IR DROP

(71) Applicant: International Business Machines Corporation, Armonk, NY (US)

(72) Inventors: Michael Sperling, Poughkeepsie, NY (US); Akil Khamisi Sutton, Dutchess County, NY (US); Pawel Owczarczyk, Highland, NY (US); Erik English, Beacon, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/578,622

(22) Filed: Sep. 23, 2019

(65) Prior Publication Data
US 2021/0091753 A1    Mar. 25, 2021

(51) Int. Cl.
*H03K 3/356*    (2006.01)
*H03K 3/037*    (2006.01)

(52) U.S. Cl.
CPC ............. *H03K 3/037* (2013.01); *H03K 3/356* (2013.01)

(58) Field of Classification Search
None
See application file for complete search history.

(56) References Cited

U.S. PATENT DOCUMENTS

| 4,128,816 | A |   | 12/1978 | Shimotsuma |
| 4,308,496 | A |   | 12/1981 | Nagano |
| 4,473,762 | A | * | 9/1984  | Iwahashi ............. H01L 27/0211 327/262 |
| 4,918,336 | A |   | 4/1990  | Graham et al. |
| 5,081,380 | A |   | 1/1992  | Chen |
| 5,197,033 | A |   | 3/1993  | Watanabe et al. |
| 5,510,729 | A |   | 4/1996  | Reymond |
| 5,610,547 | A |   | 3/1997  | Koyama et al. |
| 5,856,757 | A |   | 1/1999  | Eschauzier |
| 5,939,933 | A |   | 8/1999  | Wang |

(Continued)

FOREIGN PATENT DOCUMENTS

| CN | 100428616 C | 10/2008 |
| CN | 1938932 B   | 9/2010  |

(Continued)

OTHER PUBLICATIONS

Erik English et al., "Voltage Sensitive Current Circuit," U.S. Appl. No. 16/578,613, filed Sep. 23, 2019.

(Continued)

*Primary Examiner* — Lincoln D Donovan
*Assistant Examiner* — Khareem E Almo
(74) *Attorney, Agent, or Firm* — Cantor Colburn LLP; Margaret McNamara

(57) ABSTRACT

Aspects of the invention relate to an apparatus having a transmission gate coupled to a delay element and including a first transistor and a second transistor. A first node is coupled to a first gate of the first transistor, a first current source, and a first resistive element, an opposite end of the first resistive element being coupled to a ground potential. A second node is coupled to a second gate of the second transistor, a second current source, and a second resistive element, an opposite end of the second resistive element being coupled to a power supply.

20 Claims, 6 Drawing Sheets

(56) References Cited

U.S. PATENT DOCUMENTS

| | | | |
|---|---|---|---|
| 6,057,727 | A | 5/2000 | Dautriche et al. |
| 6,137,720 | A | 10/2000 | Lancaster |
| 6,476,656 | B2 | 11/2002 | Dally et al. |
| 6,496,056 | B1 | 12/2002 | Shoji |
| 6,661,253 | B1* | 12/2003 | Lee ................. H03K 17/063 326/101 |
| 6,686,792 | B2 | 2/2004 | Nakamiya et al. |
| 6,882,238 | B2 | 4/2005 | Kurd et al. |
| 7,321,242 | B2* | 1/2008 | Mandegaran .... H03K 19/00307 326/75 |
| 7,525,345 | B2* | 4/2009 | Jang ................. H03K 19/0013 326/83 |
| 7,911,282 | B2* | 3/2011 | Fujino ................. H03L 7/0995 331/57 |
| 8,339,190 | B2 | 12/2012 | Otsuga et al. |
| 8,648,645 | B2 | 2/2014 | Konstadinidis et al. |
| 8,841,890 | B2 | 9/2014 | Ochoa et al. |
| 8,847,777 | B2 | 9/2014 | Ramaswami |
| 9,148,057 | B2* | 9/2015 | Kim ..................... H02M 3/158 |
| 9,229,465 | B2* | 1/2016 | Dhiman .................. G05F 1/595 |
| 9,473,127 | B1* | 10/2016 | Azin ............. H03K 19/018507 |
| 9,634,651 | B1* | 4/2017 | Tseng .................... H03K 5/134 |
| 10,270,630 | B2* | 4/2019 | Yun ......................... H04L 25/08 |
| 10,833,653 | B1* | 11/2020 | Sperling .......... H03K 19/00384 |
| 2001/0054925 | A1 | 12/2001 | Dally et al. |
| 2003/0109142 | A1 | 6/2003 | Cable et al. |
| 2003/0151920 | A1 | 8/2003 | Shin |
| 2005/0094421 | A1 | 5/2005 | Flore |
| 2005/0099234 | A1 | 5/2005 | Perner |
| 2006/0055444 | A1 | 3/2006 | Ogasawara et al. |
| 2006/0076993 | A1* | 4/2006 | Teo ....................... H03L 7/0814 327/165 |
| 2006/0125529 | A1* | 6/2006 | Laulanet ............. H03K 5/2472 327/77 |
| 2007/0013414 | A1 | 1/2007 | Paillet et al. |
| 2007/0013454 | A1* | 1/2007 | Ji ......................... H03K 3/0315 331/57 |
| 2007/0079147 | A1 | 4/2007 | Pyeon et al. |
| 2008/0088365 | A1 | 4/2008 | Jang et al. |
| 2008/0218199 | A1 | 9/2008 | Matsushima |
| 2008/0246512 | A1* | 10/2008 | Seth ................. H03K 19/01721 326/83 |
| 2009/0058466 | A1* | 3/2009 | Parks .................. H03F 3/45085 327/1 |
| 2010/0164538 | A1* | 7/2010 | Greimel-Rechling ...................... H03K 19/1732 326/16 |
| 2012/0169391 | A1* | 7/2012 | Sofer .................. H03K 5/1565 327/174 |
| 2013/0034139 | A1 | 2/2013 | Khlat et al. |
| 2013/0169330 | A1* | 7/2013 | Ma ....................... H03K 5/1565 327/175 |
| 2013/0314020 | A1* | 11/2013 | Sugie ..................... H02P 6/085 318/503 |
| 2013/0342256 | A1 | 12/2013 | Wadhwa |
| 2014/0145707 | A1 | 5/2014 | Tanabe et al. |
| 2014/0292420 | A1 | 10/2014 | Green et al. |
| 2015/0042386 | A1* | 2/2015 | Bhowmik ............ H03K 17/223 327/143 |
| 2016/0034014 | A1 | 2/2016 | Turullols et al. |
| 2016/0105189 | A1 | 4/2016 | Maeda |
| 2017/0060165 | A1 | 3/2017 | Kim et al. |
| 2018/0302073 | A1* | 10/2018 | Ko ....................... H03K 5/1565 |

FOREIGN PATENT DOCUMENTS

| | | |
|---|---|---|
| CN | 205015388 U | 2/2016 |
| CN | 206331020 U | 7/2017 |
| KR | 101658783 B1 | 9/2016 |

OTHER PUBLICATIONS

Krishnaveni, S. & Bibin Sam Paul, S., "Desing of VCO Using Current Mode Logic With Low Supply Sensitivity," Feb. 2014, vol. 3, Issue 2, IJRET: International Journal of Reasearch in Engineering and Technology, pp. 528-530.

List of IBM Patents or Patent Applications Treated as Related; (Appendix P); Date Filed: Sep. 23, 2019, 2 pages.

Michael Sperling et al., "Droop Detection Using Power Supply Sensitive Delay," U.S. Appl. No. 16/578,588, filed Sep. 23, 2019.

Michael Sperling et al., "Voltage Sensitive Delay," U.S. Appl. No. 16/578,597, filed Sep. 23, 2019.

* cited by examiner

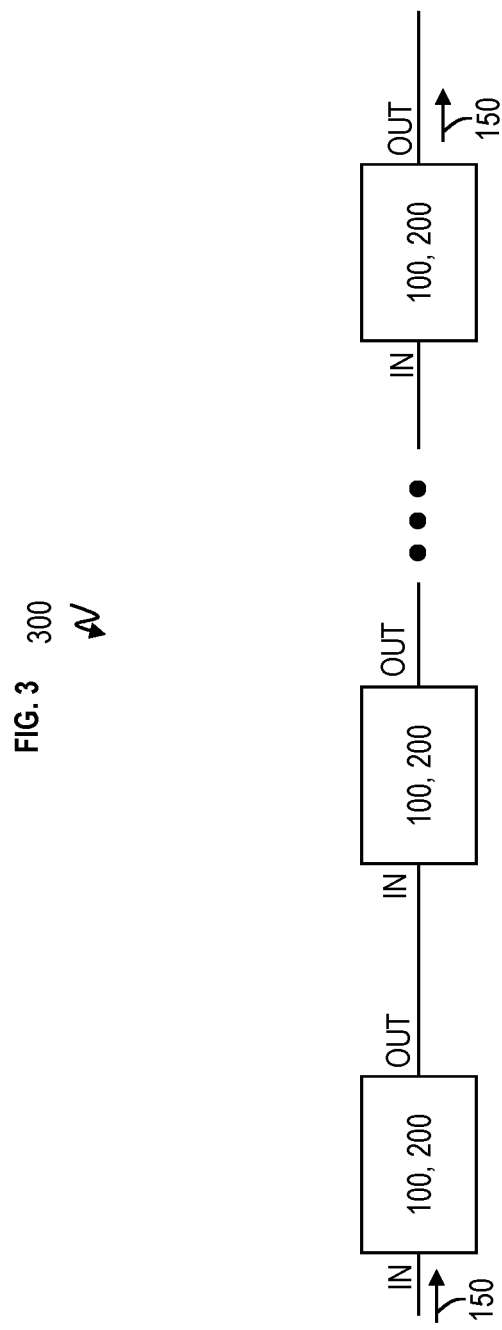

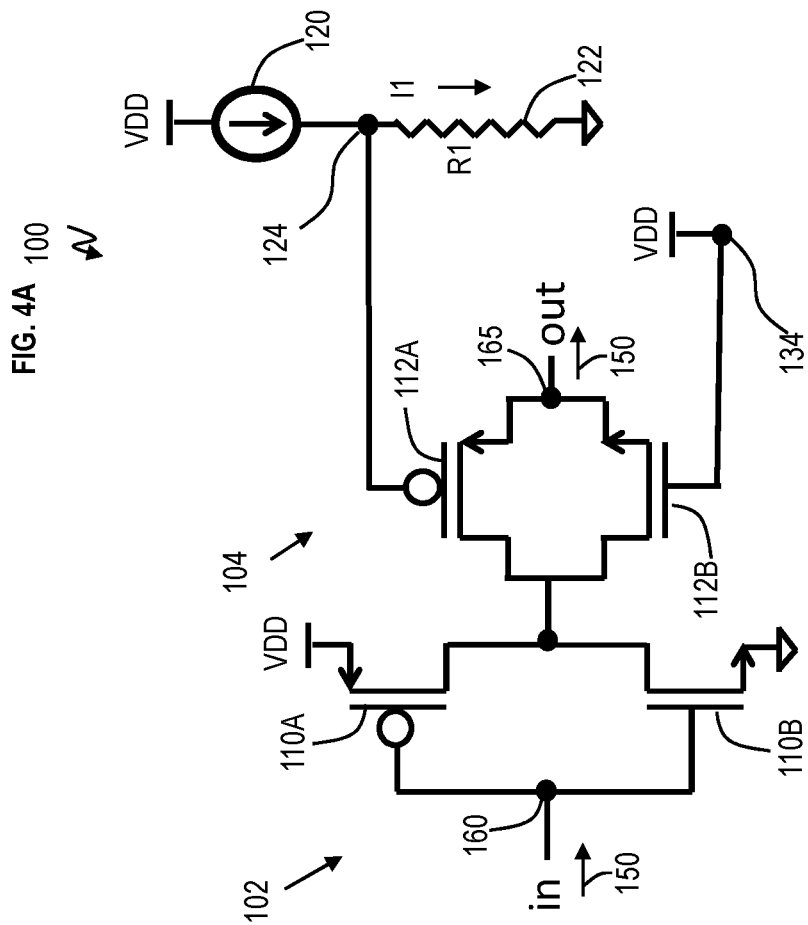

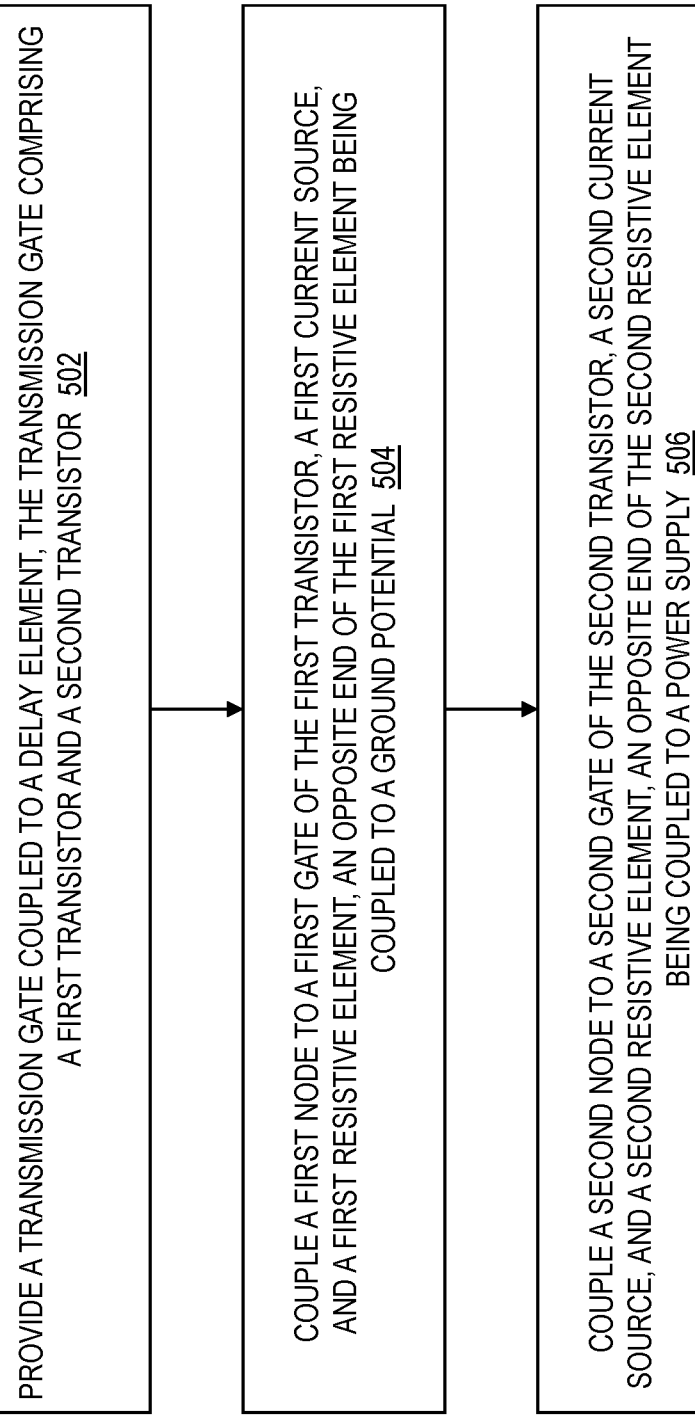

VOLTAGE STARVED PASSGATE WITH IR DROP

BACKGROUND

The present invention generally relates to integrated circuits, and more specifically, to a voltage starved passgate with IR drop (current (I) multiplied by resistance (R)).

In an electronic device, power is needed to run the device. Semiconductor devices, such as microprocessors, stand-alone and embedded memory devices, etc., receive power from a power supply. Microprocessors can execute instructions resulting in certain tasks being performed. In some cases, there can be a current spike or a change in current consumption because of the different instructions executed by the microprocessor, which causes voltage variation or spikes, known as droops on the power supply. This may occur because some instructions might require more power than others. A droop is defined as an output voltage change as a function of time and may include both under-voltage and over-voltage conditions. A voltage droop refers to a loss of supply voltage as a device tries to drive a load. Under certain operating conditions, a voltage droop may lead to an integrated circuit's power supply falling below proper operating levels.

SUMMARY

Embodiments of the present invention are directed to a voltage starved passgate with IR drop. A non-limiting example apparatus includes a transmission gate coupled to a delay element and including a first transistor and a second transistor. The apparatus includes a first node coupled to a first gate of the first transistor, a first current source, and a first resistive element, an opposite end of the first resistive element being coupled to a ground potential. Also, the apparatus includes a second node coupled to a second gate of the second transistor, a second current source, and a second resistive element, an opposite end of the second resistive element being coupled to a power supply.

A non-limiting example method includes providing a transmission gate coupled to a delay element, the transmission gate comprising a first transistor and a second transistor. The method includes coupling a first node to a first gate of the first transistor, a first current source, and a first resistive element, an opposite end of the first resistive element being coupled to a ground potential. Also, the method includes coupling a second node to a second gate of the second transistor, a second current source, and a second resistive element, an opposite end of the second resistive element being coupled to a power supply.

A non-limiting example apparatus includes a delay element having two transistors coupled together. The apparatus includes a transmission gate coupled to the delay element and including a first transistor and a second transistor. The apparatus includes a first node coupled to a first gate of the first transistor, a first current source, and a first resistive element, an opposite end of the first resistive element being coupled to a ground potential. Also, the apparatus includes a second node coupled to a second gate of the second transistor, a second current source, and a second resistive element, an opposite end of the second resistive element being coupled to a power supply.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 3 illustrates a block diagram of example circuits connected in a chain in accordance with one or more embodiments of the present invention;

FIG. 4A illustrates a block diagram of an example circuit in accordance with one or more embodiments of the present invention;

FIG. 5 illustrates a flow diagram of a method for configuring a circuit in accordance with one or more embodiments of the present invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiments of the present invention provide a delay circuit that makes delay more sensitive to changes in voltage of a power supply (VDD). The delay circuit becomes faster (i.e., delay decreases) as the voltage increases, and the delay circuit becomes slower (i.e., delay increases) as the voltage decreases (i.e., voltage drops).

Voltage-insensitive delay is what is typically desired in electronic devices such as microprocessors or processors, meaning that delay of signals on the processor, for example the clock signal, is usually not sensitive to changes in voltage. However, microprocessors need to detect voltage droops or drops in the voltage supply (VDD), and this can be accomplished by making delays sensitive to voltage in accordance with one or more embodiments of the invention. In one or more embodiments, the delay circuit can be utilized in a digital droop sensor that recognizes when the voltage is drooping by making delay of a clock signal increase in relation to a decrease in voltage and vice versa. For example, a clock signal travels through a delay line and (either one or more cycles later) is latched along a string of latches spaced out by minimum delays. The location of the edge (e.g., rising edge or falling edge of a cyclical waveform) of the clock signal in the string of latches is a proxy for the power supply voltage, as changes in power supply slow down or speed up the delays along the path.

Figure 1:
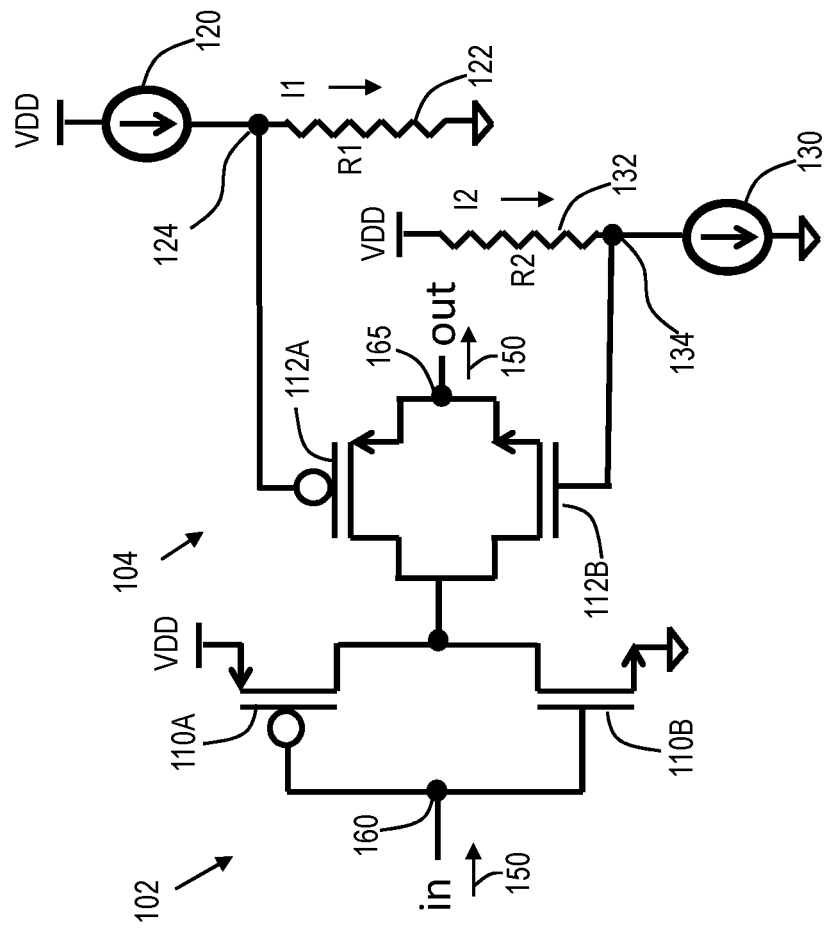
FIG. 1 illustrates a block diagram of an example circuit in accordance with one or more embodiments of the present invention.

Turning now to FIG. 1, a circuit 100 for providing voltage sensitive delay is generally shown in accordance with one or more embodiments of the present invention. The circuit 100 is a delay circuit which makes delay more sensitive to changes in voltage of a power supply (VDD) by having voltage starved passgates or transmission gates with IR (current (I) multiplied by resistance (R)) drop (down or up).

Particularly, the circuit 100 includes passgates or transmission gates 104 which include a p-type field effect transistor (pFET) 112A (having more holes than electrons) and an n-type field effect transistor (nFET) 112B (having more electrons than holes) coupled together at their drains and sources. Their drains are coupled to a delay element 102 which passes a signal. The delay element 102 may be an inverter which includes a pFET 110A coupled to an nFET 110B operating in a manner known to those skilled in the art. In some embodiments, the delay element 102 is a buffer or another type of delay element. In other embodiments, the delay element 102 is a logic circuit.

In the passgates or transmission gates 104, the gate of the pFET 112A is coupled to a first node 124. The first node 124 is coupled to the output of a current source 120 and one end of a first resistor 122, while the other end of the first resistor 122 is connected to ground. The gate of the nFET 112B is coupled to a second node 134. The second node 134 is coupled to one end of a second resistor 132 while the opposite end of the second resistor is coupled to power supply (VDD) which is the voltage source being monitored. The second node 134 is coupled to the input of a current source 130. The first resistor 122 may have a resistance value R1 and the second resistor 132 may have a resistance value R2. The current source 120 may have a current value I1 and the current source 130 may have a current value I2. In some examples, R1=R2 and I1=I2. In some examples, R1 is greater than R2 or vice versa. In some example, I1 is greater than I2 or vice versa.

A signal 150 is received at an input node 160 and output at an output node 165. The circuit 100 (as well as circuit 200 discussed in FIG. 2) makes delay in the signal 150 more sensitive to changes in voltage of the power supply (VDD). The circuit 100 is faster as the voltage of power supply (VDD) increases, meaning the delay of signal 150 passing from input node 160 to output node 165 decreases as the voltage of power supply (VDD) increases. The circuit 100 becomes slower as the voltage of power supply (VDD) decreases (i.e., voltage drops), meaning the delay of signal 150 passing from input node 160 to output node 165 increases as the voltage of power supply (VDD) decreases.

Figure 2:
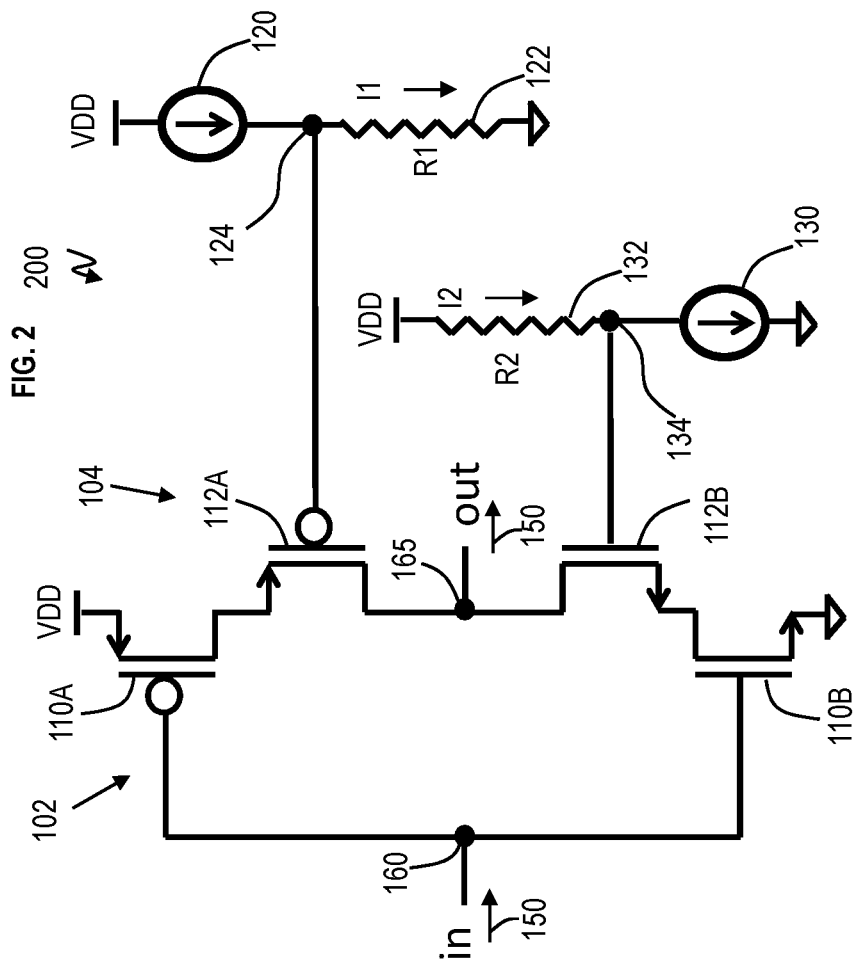
FIG. 2 illustrates a block diagram of an example circuit in accordance with one or more embodiments of the present invention.

Turning now to FIG. 2, a circuit 200 for providing voltage sensitive delay is generally shown in accordance with one or more embodiments of the present invention. Instead of both the pFET 112A and nFET 112B being tied together and connected to the delay element 102 as shown in FIG. 1, FIG. 2 illustrates the pFET 112A and nFET 112B being separately connected to the delay element 102. As can be seen in FIG. 2, the passgates/transmission gates 104 are folded into the inverter (i.e., delay element 102) itself where the pFET 112A coupled to the first node 124 is connected between the inverter pFET 110A and output node 165, and the nFET 112B connected to the second node 134 is connected between the inverter nFET 110B and the output node 165. The circuit 200 includes the same elements as circuit 100. The circuits 100 and 200 both function the same as discussed herein to carry out embodiments of the invention. Accordingly, discussion of circuit 100 applies by analogy to circuit 200 and vice versa.

In contemporary pFET and nFET connections for passgates/transmission gates, the gate of the pFET is connected directly to ground and the gate of the nFET is connected directly to a power supply (e.g., VDD) in order to turn both transistors on as strongly as possible. However, in the circuit 100 shown in FIG. 1 and circuit 200 shown in FIG. 2, the passgates/transmission gates have an increased delay since they are not turned on as strongly. Therefore, a droop in the voltage (power) is more sensitive because the gate connected at the second node 134 is at a value lower than the value of power supply (VDD) and because the gate connected at first node 124 is at a value higher than the value of ground (e.g., typically 0 volts for illustration purpose). Particularly, in accordance with one or more embodiments of the present invention, instead of the pFET 112A being connected to ground, the gate of pFET 112A is connected to the first node 124 which has a voltage relationship of the current I1 from the current source 120 times resistance R1 of the first resistor 122, thereby creating a voltage drop up (I1×R1) from the value of ground. Similarly, instead of the nFET 112B being to connected to VDD, the gate of nFET 112B is connected to the second node 134 which has a voltage relationship of the current I2 from the current source 130 times resistance R2 of the second resistor 132, thereby creating a voltage drop down (I2×R2) from the value of power supply (VDD). Ground can be a voltage or potential at 0 volts, and in some cases, ground can be some represented as VSS or the most negative voltage. The power supply voltage VDD is the most positive voltage (e.g., 1 volt). The circuit 100 is configured to determine when the value of the power supply voltage (VDD) drifts towards the value of the ground voltage/ground potential (VSS), and this drift is referred to a voltage droop.

Further, it should be noted that it is not just that the passgates or transmission gates 104 are connected to a different node that makes the delay sensitive to power supply (VDD). It is also that the circuit 100, 200 is using an I×R voltage drop down from power supply (VDD) (the power rail) where current I1 represents current I and resistance R1 represents R in the nFET case and using an I×R voltage drop up from ground where current I2 represents current I and resistance R2 represents R in the pFET case; both the nFET and pFET cases make the delay extra sensitive to power supply (VDD) movements. This is because with an I×R voltage drop as opposed to a resistor divider, the gate voltage will move with a 1:1 (one-to-one) ratio with movements in the value of the power supply (VDD) in embodiments of the invention. However, in a resistor divider, the gate voltage would only move by a fraction of the power supply. Thus, the design of the circuit 100, 200 in one or more embodiments of the invention is more sensitive to power supply changes than state-of-the-art circuits. As an additional feature, the current in the current source itself, such as current sources 120 and 130, can be sensitive to movements in the power supply (VDD) for even more delay change when the power supply moves.

As noted above, the gate connections of the passgates or transmission gates 104 make the pFET 112A and nFET 112B more sensitive to voltage drops of power supply (VDD). After a signal 150 is input to the delay element 102, the signal 150 arrives from the delay element 102 (e.g., an inverter) to the pFET 112A and nFET 112B, and the delay (i.e., additional time) in turning on transistors pFET 112A and nFET 112B increases the delay in passing the signal 150, thereby, detecting decreases in power supply (VDD) because of the added delay. Both transistors pFET 112A and nFET 112B are turned on by their respective gate voltage and are trying to pass signals which cause their own delay. Instead of reducing resistance with resistor divider, one or more embodiments of the invention use I×R voltage drop (up and/or down) to maintain full power supply sensitivity while still starving the passgates or transmission gates 104 of voltage.

FIG. 3 illustrates a block diagram of an example system 300 of circuits 100, 200 coupled together in a daisy chain according to one or more embodiments of the invention. Each circuit 100, 200 is sensitive to changes in power supply (VDD) and ground voltage, and each circuit 100, 200 adds further delay to when passing the signal 150.

Figure 4B:
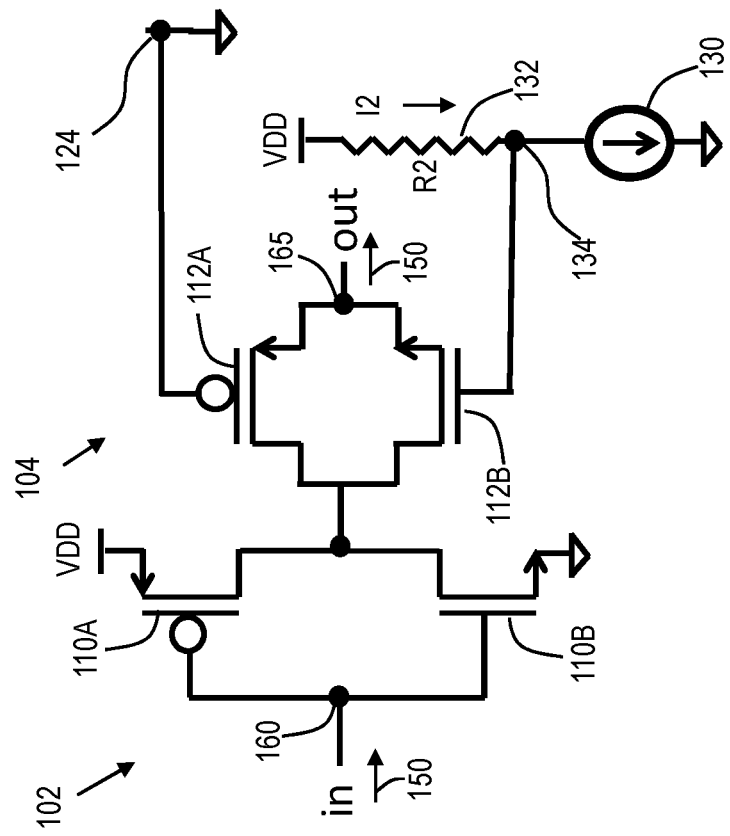
FIG. 4B illustrates a block diagram of an example circuit in accordance with one or more embodiments of the present invention.

There can be modifications to the connections for the gates of the passgates or transmission gates 104 as discussed below in FIGS. 4A and 4B. FIG. 4A illustrates the circuit 100 with a modification to the passgates or transmission gates 104 in which the second resistor 132 and current source 130 are removed according to one or more embodiments. In FIG. 4A, the gate of the nFET 112B is coupled directly to the power supply (VDD). FIG. 4B illustrates the circuit 100 with a modification to the passgates or transmission gates 104 in which the first resistor 122 and current source 120 are removed according to one or more embodiments. In FIG. 4B, the gate of the pFET 112A is coupled directly to ground. FIG. 4A is tuned to detecting changes in the ground voltage, while FIG. 4B is tuned to detecting changes in power supply (VDD).

FIG. 5 illustrates a flow diagram 500 of a method for configuring the circuit 100, 200 in accordance with one or more embodiments of the invention. At block 502, passgates or transmission gates 104 are coupled to a delay element 102, the passgates or transmission gates 104 comprising a first transistor (e.g., pFET 112A) and a second transistor (e.g., nFET 112B). At block 504, a first node 124 is coupled to a first gate of the first transistor (e.g., pFET 112A), a first current source 120, and a first resistive element (e.g., resistor 122), an opposite end of the first resistive element (e.g., resistor 122) being coupled to a ground potential. At block 506, a second node 134 is coupled to a second gate of the second transistor (e.g., nFET 112B), a second current source 130, and a second resistive element (e.g., resistor 132), an opposite end of the second resistive element (e.g., resistor 132) being coupled to a power supply (VDD).

The first resistive element (e.g., resistor 122) is configured to cause a delay in powering on the first transistor (e.g., pFET 112A) according to an increase in the ground potential. The first resistive element (e.g., resistor 122) is configured to cause a delay in powering on the first transistor (e.g., pFET 112A), an amount of the delay being in direct relation to a magnitude of an increase in the ground potential.

The second resistive element (e.g., resistor 132) is configured to cause a delay in powering on the second transistor (e.g., nFET 112B) according to a decrease in the power supply (VDD). The second resistive element (e.g., resistor 132) is configured to cause a delay in powering on the second transistor (e.g., nFET 112B), an amount of the delay being in direct relation to a magnitude of a decrease in a voltage supplied by the power supply (VDD).

The first transistor (e.g., pFET 112A) is configured to be powered on by a logical low voltage supplied by the ground potential. The first resistive element (e.g., resistor 122) is configured to cause the first gate to receive a voltage drop up from the ground potential, so as to be greater than the logical low voltage. The voltage drop up is based on current I1 from the first current source 120 and resistance of the first resistive element (e.g., resistor 122), and the first transistor (e.g., pFET 112A) is configured to be powered off by a logical high voltage (e.g., 1 V) which is greater than the logical low voltage (0 V). The voltage drop up is configured to cause a delay in powering on the first transistor (e.g., pFET 112A), an amount of the delay being in direct relation to a magnitude of an increase in the ground potential. In other words, the voltage drop up causes the pFET 112A to power on slower than if the gate of the pFET 112A were connected directly to ground; when the ground voltage of ground rises, the voltage drop up results in a larger rise in ground voltage/ground potential, thereby causing the pFET 112A to turn on even slower than if its gate were directly connected to ground. This results in a delay in passing the signal 150, and the delay increases as the ground potential/ ground voltage increases.

The second transistor (e.g., nFET 112B) is configured to be powered on by a logical high voltage (e.g., 1 V) supplied by the power supply (VDD), and the second resistive element (e.g., resistor 132) is configured to cause the second gate to receive a voltage drop down from the power supply (VDD), so as to be less than the logical high voltage. The voltage drop down is based on current I2 from the second current source 130 and resistance of the second resistive element (e.g., resistor 132). The second transistor (e.g., nFET 112B) is configured to be powered off by a logical low voltage (e.g., 0 V) which is less than the logical high voltage. The voltage drop down is configured to cause a delay in powering on the second transistor (e.g., nFET 112B), an amount of the delay being in direct relation to a magnitude of a decrease in (voltage from) the power supply. In other words, the voltage drop down causes the nFET 112B to power on slower than if the gate of the nFET 112B were connected directly to the power supply (VDD); when the voltage of power supply decreases, the voltage drop down results in a larger decrease in voltage of power supply (VDD), thereby causing the nFET 112B to turn on even slower than if its gate were directly connected to power supply (VDD). This results in a delay in passing the signal 150, and the delay increases as the voltage of power supply (VDD) decreases.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An apparatus comprising:
   a transmission gate coupled to a delay element and comprising a first transistor and a second transistor, the first transistor and the second transistor both having drains shorted together to the delay element and having sources shorted together to an output;
   a first node directly coupled to a first gate of the first transistor which is a PFET, a first current source, and a first resistive element, an opposite end of the first resistive element being coupled to a ground potential; and
   a second node directly coupled to a second gate of the second transistor which is an NFET, a second current source, and a second resistive element, an opposite end of the second resistive element being coupled to a power supply, the first node directly coupled to the first gate being different from and not connected to the second node directly coupled to the second gate, the first resistive element being a two-terminal element having no terminal connected to the second node, the second resistive element being another two-terminal element having no terminal connected to the first node;
   wherein a voltage drop up from the ground potential is created at the first node by having the first resistive element coupled to both the ground potential and the first node thereby increasing sensitivity of the first transistor to a voltage droop in the power supply;
   wherein the delay element, the first resistive element, and the second current source are all connected to the ground potential which is a same for all.

2. The apparatus of claim 1, wherein the delay element comprises transistors having drains shorted together and connected directly to the drains of the first transistor and the second transistor.

3. The apparatus of claim 1, wherein the first resistive element is configured to cause a delay in powering on the first transistor, an amount of the delay being in direct relation to a magnitude of an increase in the ground potential.

4. The apparatus of claim 1, wherein the second resistive element is configured to cause a delay in powering on the second transistor, an amount of the delay being in direct relation to a magnitude of a decrease in a voltage supplied by the power supply.

5. The apparatus of claim 1, wherein:
the first transistor is configured to be powered on by a logical low voltage supplied by the ground potential; and
the first resistive element is configured to cause the first gate to receive a voltage drop up from the ground potential, so as to be greater than the logical low voltage.

6. The apparatus of claim 5, wherein:
the voltage drop up is based on current from the first current source and resistance of the first resistive element; and
the first transistor is configured to be powered off by a logical high voltage which is greater than the logical low voltage.

7. The apparatus of claim 5, wherein the voltage drop up is configured to cause a delay in powering on the first transistor, an amount of the delay being in direct relation to a magnitude of an increase in the ground potential.

8. The apparatus of claim 1, wherein:
the second transistor is configured to be powered on by a logical high voltage supplied by the power supply; and
the second resistive element is configured to cause the second gate to receive a voltage drop down from the power supply, so as to be less than the logical high voltage.

9. The apparatus of claim 8, wherein:
the voltage drop down is based on current from the second current source and resistance of the second resistive element; and
the second transistor is configured to be powered off by a logical low voltage which is less than the logical high voltage.

10. The apparatus of claim 8, wherein the voltage drop down is configured to cause a delay in powering on the second transistor, an amount of the delay being in direct relation to a magnitude of a decrease in the power supply.

11. A method comprising:
providing a transmission gate coupled to a delay element, the transmission gate comprising a first transistor and a second transistor, the first transistor and the second transistor both having drains shorted together to the delay element and having sources shorted together to an output;
coupling a first node directly to a first gate of the first transistor which is a PFET, a first current source, and a first resistive element, an opposite end of the first resistive element being coupled to a ground potential; and
coupling a second node directly to a second gate of the second transistor which is an NFET, a second current source, and a second resistive element, an opposite end of the second resistive element being coupled to a power supply, the first node directly coupled to the first gate being different from and not connected to the second node directly coupled to the second gate, the first resistive element being a two-terminal element having no terminal connected to the second node, the second resistive element being another two-terminal element having no terminal connected to the first node;
wherein a voltage drop up from the ground potential is created at the first node by having the first resistive element coupled to both the ground potential and the first node thereby increasing sensitivity of the first transistor to a voltage droop in the power supply;

wherein the delay element, the first resistive element, and the second current source are all connected to the ground potential which is a same for all.

12. The method of claim 11, wherein the delay element comprises transistors having drains shorted together and connected directly to the drains of the first transistor and the second transistor.

13. The method of claim 11, wherein the first resistive element is configured to cause a delay in powering on the first transistor, an amount of the delay being in direct relation to a magnitude of an increase in the ground potential.

14. The method of claim 11, wherein the second resistive element is configured to cause a delay in powering on the second transistor according to a decrease in the power supply.

15. The method of claim 11, wherein the second resistive element is configured to cause a delay in powering on the second transistor, an amount of the delay being in direct relation to a magnitude of a decrease in a voltage supplied by the power supply.

16. The method of claim 11, wherein:
the first transistor is configured to be powered on by a logical low voltage supplied by the ground potential; and
the first resistive element is configured to cause the first gate to receive a voltage drop up from the ground potential, so as to be greater than the logical low voltage.

17. The method of claim 16, wherein:
the voltage drop up is based on current from the first current source and resistance of the first resistive element;
the first transistor is configured to be powered off by a logical high voltage which is greater than the logical low voltage; and
the voltage drop up is configured to cause a delay in powering on the first transistor, an amount of the delay being in direct relation to a magnitude of an increase in the ground potential.

18. The method of claim 11, wherein:
the second transistor is configured to be powered on by a logical high voltage supplied by the power supply;
the second resistive element is configured to cause the second gate to receive a voltage drop down from the power supply, so as to be less than the logical high voltage;
the voltage drop down is based on current from the second current source and resistance of the second resistive element;
the second transistor is configured to be powered off by a logical low voltage which is less than the logical high voltage; and
the voltage drop down is configured to cause a delay in powering on the second transistor, an amount of the delay being in direct relation to a magnitude of a decrease in the power supply.

19. An apparatus comprising:
a delay element having two transistors coupled together;
a transmission gate coupled to the delay element and comprising a first transistor and a second transistor, the first transistor and the second transistor both having drains shorted together to the delay element and having sources shorted together to an output;
a first node directly coupled to a first gate of the first transistor which is a PFET, a first current source, and a first resistive element, an opposite end of the first resistive element being coupled to a ground potential; and a second node directly coupled to a second gate of the second transistor which is an NFET, a second current source, and a second resistive element, an opposite end of the second resistive element being coupled to a power supply, the first node directly coupled to the first gate being different from and not connected to the second node directly coupled to the second gate, the first resistive element being a two-terminal element having no terminal connected to the second node, the second resistive element being another two-terminal element having no terminal connected to the first node;

wherein a voltage drop up from the ground potential is created at the first node by having the first resistive element coupled to both the ground potential and the first node thereby increasing sensitivity of the first transistor to a voltage droop in the power supply;

wherein the delay element, the first resistive element, and the second current source are all connected to the ground potential which is a same for all.

20. The apparatus of claim 1, wherein the delay element, the first current source, and the second resistive element are all connected to the power supply which is a same for all.

* * * * *